(12) United States Patent
Kiehl

(10) Patent No.: US 6,294,940 B1
(45) Date of Patent: Sep. 25, 2001

(54) SYMMETRIC CLOCK RECEIVER FOR DIFFERENTIAL INPUT SIGNALS

(75) Inventor: Oliver Kiehl, Charlotte, VT (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/598,349

(22) Filed: Jun. 21, 2000

(51) Int. Cl.[7] .................................................. H03K 3/00
(52) U.S. Cl. ........................... 327/291; 327/299; 327/172
(58) Field of Search .................................. 327/156, 159, 327/158, 147, 149, 165, 167, 164, 52, 53, 291, 299, 172, 176, 65, 67

(56) References Cited

U.S. PATENT DOCUMENTS

| | | | |
|---|---|---|---|
| 3,828,347 | * 8/1974 | Sacks et al. | 340/347 |
| 4,906,943 | 3/1990 | Koch | 330/258 |
| 5,467,089 | 11/1995 | Draxelmayr | 341/150 |
| 5,719,576 | 2/1998 | Draxelmayr | 341/150 |
| 6,023,615 | * 2/2000 | Bruckert et al. | 455/277.2 |
| 6,043,694 | 3/2000 | Dortu | 327/156 |

* cited by examiner

Primary Examiner—Tuan T. Lam
Assistant Examiner—Hiep Nguyen
(74) Attorney, Agent, or Firm—Stanton C. Braden

(57) ABSTRACT

A clock circuit, in accordance with the present invention, includes a first circuit stage for providing a first output signal and a second output signal. The first circuit stage includes inputs for clock signals. A switch is coupled to the first stage for switching an output polarity by selecting one of the first output signal and the second output signal generated by the first circuit stage in accordance with a control signal. A second circuit stage is coupled to the first circuit stage through the switch. The second circuit stage for shaping the first and second output signals input thereto from the switch. The second circuit stage includes an output for outputting clock pulses based on the first and second output signals. The control signal is generated from the clock pulses.

24 Claims, 7 Drawing Sheets

SYMMETRIC CLOCK RECEIVER FOR DIFFERENTIAL INPUT SIGNALS

BACKGROUND

1. Technical Field

This disclosure relates to clock receivers and more particularly, to clock receiver circuits, which receive fully differential clock signals and create controlled clock pulses from each transition.

2. Description of the Related Art

Higher clock rates for clock devices, such as clock receivers, are desired in integrated circuits where performance criteria is increased from one generation of devices to the next. For example, with the advent of double data rate (DDR) synchronous dynamic random access memory (SDRAM) new requirements for the clock receiver arise. These goals include:

A: The delay matching between a rising clock edge to an internal clock with a falling clock edge to an internal clock (with double rate) becomes more important; and B: The AC-impedance of positive and negative clock input pins should match very well.

Referring to FIG. 1, a standard differential amplifier based receiver 10 does not fulfill requirements A and B very well. The impedance of the internal nodes OUTN and OUTP differ by orders of magnitude so the effect of Miller-coupling is much larger for input VINP (e.g., CK). (For large systems, this makes it difficult for a System Clock driver to supply a good symmetric clock signal).

As shown in FIG. 2, clock signals CK and /CK are received by differential amplifier 20. Pulse generator circuits 22 use a pulse created from a positive edge, and this pulse, together with a pulse created from a inverted negative edge (by inverter 23), are used (by employing an OR function 24) to create a double data rate pulse. This structure, however, may not satisfy goals A and B in every case. The circuit of FIG. 2 includes an additional inverter 23, which can create timing mismatches.

To attempt to fulfill goals A and B, structures such as the one illustratively shown in FIG. 3 have been proposed. This structure includes two differential amplifiers 30. The CK and /CK signals are input to opposite input nodes of each amplifier 30. Pulse generators 32 create pulses on each rising edge of the output of the amplifiers 30. The outputs are ORed by OR function 34 to provide a double rate output. The drawback of this structure is the high current consumption (due to the second pulse generator and second amplifier) and the two separate pulse generators 32 used give rise to timing mismatches.

Therefore, a need exists for a clock receiver, which provides symmetric or matched delay output clock pulses and minimizes power consumption.

SUMMARY OF THE INVENTION

A clock circuit, in accordance with the present invention, includes a first circuit stage for providing a first output signal and a second output signal. The first circuit stage includes inputs for clock signals. A switch is coupled to the first stage for switching an output polarity by selecting one of the first output signal and the second output signal generated by the first circuit stage in accordance with a control signal. A second circuit stage is coupled to the first circuit stage through the switch. The second circuit stage for shaping the first and second output signals input thereto from the switch. The second circuit stage includes an output for outputting clock pulses based on the first and second output signals. The control signal is generated from the clock pulses.

In alternate embodiments, the first circuit stage may include a differential amplifier. The differential amplifier may include a current mirror for generating a first current to generate the first and second outputs signals. The current mirror may include a first current mirror portion which generates the first output signal and a second current mirror portion which generates the second output signal wherein the first and the second current mirror portions are selectable in accordance with the control signal. The differential amplifier may include a direct current load for generating a first current to generate the first and second outputs signals. The differential amplifier may include a first current source for generating a first current to generate the first and second outputs signals and a second current source for generating a second current such that hysteresis at the output of the second circuit stage is controlled. The hysteresis may be given by $H = (I_{first} - I_{second}/2)/gm$ where $I_{first}$ is the first current, $I_{second}$ is the second current and gm is the transconductance of the differential amplifier.

The clock pulses are preferably generated for both rising and falling edges of the input clock signals. The circuit may include a driver coupled to the switch, and the driver may include transfer gates driven by the output of the second stage, the driver for generating the control signal for the switch. The pulse shaper may include a self-resetting pulse generator. The first circuit stage may include a fully differential current mirror amplifier. The first circuit stage may include a differential amplifier with a folded cascode load.

A double data rate clock circuit, in accordance with the present invention, includes a first circuit stage including a differential amplifier for providing a first output signal and a second output signal. The first circuit stage includes inputs for clock signals, and the first stage includes a transfer gate for switching an output polarity by selecting one of the first output signal and the second output signal generated by the differential amplifier in accordance with a control signal. A second circuit stage is coupled to the first circuit stage, and the second circuit stage includes a pulse generator for receiving the first output signal and the second output signal and generating clock pulses to be output from the pulse generator in accordance with the first output signal and the second output signal. A toggle switch generates the control signal based on an output of the pulse generator.

In other embodiments, the differential amplifier may include a current mirror for generating a first current to generate the first and second outputs signals. The current mirror may include a first current mirror portion which generates the first output signal and a second current mirror portion which generates the second output signal wherein the first and the second current mirror portions are selectable in accordance with the control signal. The differential amplifier may include a direct current load for generating a first current to generate the first and second output signals. The differential amplifier may further include a first current source for generating a first current to generate the first and second output signals and a second current source for generating a second current such that hysteresis at the output of the second circuit stage is controlled. The hysteresis may be given by $H = (I_{first} - I_{second}/2)/gm$, where $I_{first}$ is the first current, $I_{second}$ is the second current and gm is the transconductance of the differential amplifier. The clock pulses are preferably generated for both rising and falling edges of the input clock signals. The toggle switch may include transfer gates driven by the output of the second circuit stage, and the driver generates the control signal for the transfer gates. The pulse generator may include a self-resetting pulse generator. The first circuit stage may include a folded cascode load differential amplifier. The first circuit stage may includes a fully differential current mirror amplifier.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides circuits that receive a fully differential clock signal and creates controlled clock pulses off each (rising and falling) transition. The delay of the pulses from falling and rising edge match very well, which is one feature important for applications such as double data rate devices, such as DDR-SDRAMs (double data rate synchronous dynamic random access memories). Other applications and devices are also contemplated. The receiver of the present invention preferably presents an equal impedance load to its positive and negative input nodes.

It is to be understood that the circuits shown in FIGS. 4, 5, 6A–6D, 7A–B, 8 and 9 may be implemented in a plurality of different configurations. The configurations shown in the FIGS. are illustrative and should therefore not be construed as limiting the present invention. For example, polarities of transistors or diodes may be switched, e.g., PFETS to NFETS and vice versa. Although the present invention will be described illustratively in terms of a double data rate clock receiver, other circuits may benefit from employing the present invention. For example, the present invention may be utilized for normal clock receivers without double edge detection.

Figure 4:
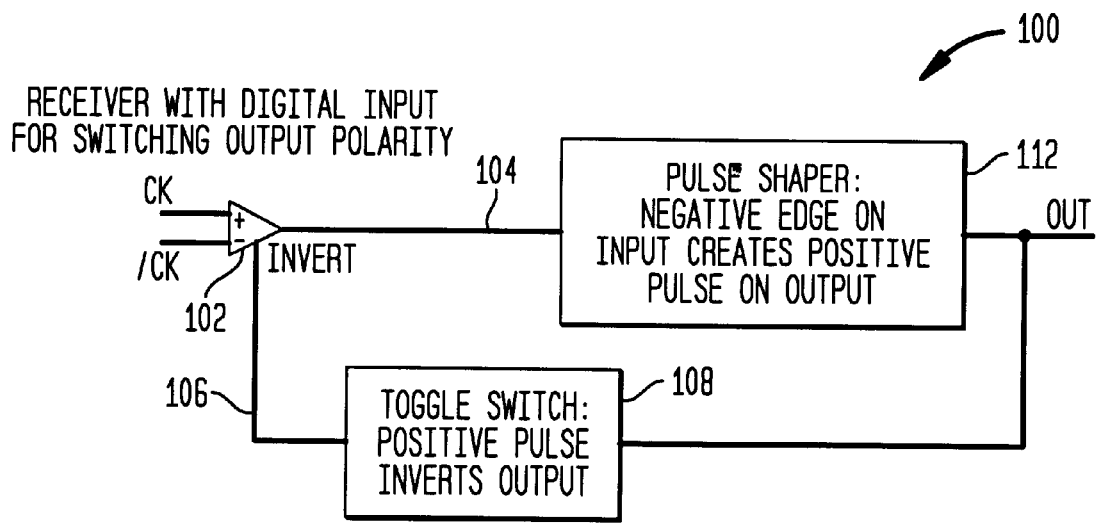
FIG. 4 is a schematic diagram a clock receiver employing a pulse generator and a toggle switch/driver to provide a double data rate in accordance with the present invention.

Referring now in specific detail to the drawings in which like reference numerals identify similar or identical elements throughout the several views, and initially to FIG. 4, a receiver circuit 100 is shown in accordance with one embodiment of the present invention. Circuit 100 advantageously minimizes current consumption and maximizes delay matching by employing an input stage 102 which can produce an inverted output signal 104 (depending on the logic state of a control input 106). In one embodiment, control input signal 106 is toggled by a driver or toggle switch 108 which toggles with each pulse taken from output OUT of the structure. A pulse shaper 112 provides clock pulses from negative edges received from the input stage 102. When OUT has a positive pulse thereon, switch 108 sends invert or control signal 106 to input stage 102 to cause the output 104 of receiver 102 to switch polarity. This may be performed by a transfer gate, switching mechanism or other circuitry included in input stage 102. In this way, positive pulses of OUT cause signal 106 to invert the output (104) of input stage 102 to yield negative edges. In this way, pulse shaper 112 receives negative edges at a doubled rate and converts the inputs to clock pulses at OUT. Since the pulses stemming from the rising and the falling clock edges (CK and /CK) are generated in the very same circuit, advantageously, one circuit performs the operations without duplicating input stages (e.g., including amplifiers) or pulse generators, this reduces delay between pulses (e.g., better matching, thus, maximizing delay matching) and reduces current consumption (e.g., power requirements).

Many possible implementations for input receiver stage 102 are contemplated. Some of these implementations will be illustratively described below.

Figure 5:
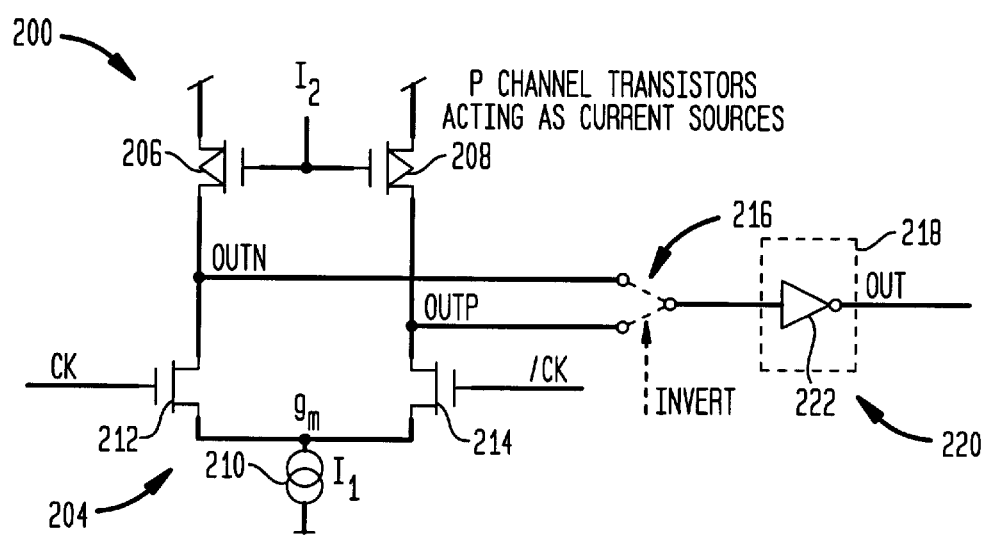
FIG. 5 is a schematic diagram of a first stage of the clock receiver of FIG. 4 showing a switch controlled by the toggle switch driver control signal in accordance with the present invention.

Referring to FIG. 5, a circuit is shown, which includes an input stage 200 of a receiver circuit. Input stage 200 preferably includes a differential amplifier 204. Differential amplifier 204 advantageously provides a built-in hysteresis by choosing the currents $I_1$ and $I_2$ as desired. The hysteresis may be approximately given by $H =(I_2-(I_1/2))/gm$ where gm is the transconductance. In this way, hysteresis at the output OUT can be well controlled. Differential amplifier 204 includes two load elements 206 and 208. In one embodiment, load elements 206 and 208 include p-type field effect transistors (PFET) transistors. In other embodiments, load elements 206 and 208 include other types of current sources, resistors, diodes or other elements or circuits known in the art to control current. In the embodiment where PFETs are employed for load elements 206 and 208, a gate voltage of the p-channel transistors is preferably generated from a current (e.g., $I_2$) that matches $I_1$. $I_1$ is preferably provided by a current source 210, which may be embodied by an appropriately sized transistor (e.g., a field effect transistor (FET)). Clock edges (CK and /CK) are input at gates of transistors 212 and 214 to enable the amplifier 204. CK represents VINP and /CK represents VINN for the amplifier 204. A toggle switch 216 is included to switch between OUTP and OUTN of the amplifier 204. Switch 216 is preferably an electronic switch, which includes, at least one transfer gate (e.g., MOS transfer gates) which is switched in accordance with an INVERT signal.

INVERT signal may be generated in a plurality of ways. In a preferred embodiment, INVERT signal is generated as shown in FIG. 4. In this way, the output (OUT) is employed as feedback for toggle switch 108 (FIG. 4). Toggle switch 108 generates the INVERT signal, which switches the amplifier 204 to output one of OUTN or OUTP. Switching is performed when, for example, negative edges of the output OUT are encountered (See e.g., FIG. 4). In this way, a double data rate is provided at the output OUT. OUTN and OUTP alternately provide positive and negative edges. Positive edges are advantageously switched off, thus providing only negative edges to pass through switch 216. Negative edges are then shaped into positive edges for clock pulses in a second stage 220. A pulse shaper 218, illustratively shown in FIG. 5 as an inverter 222 is employed to create clock pulses from the negative edges. Other gates or circuits may also be employed for pulse shaper as well. Pulse shaper 218 also provides the pulse width of the clock pulses. It is to be understood that polarities (e.g., negative or positive edges) as well as transistor types (e.g., N-type field effect transistors (NFETS) or p-type field effect transistors (PFETS) may be switched accordingly as known to those skilled in the art.

Figure 6A:
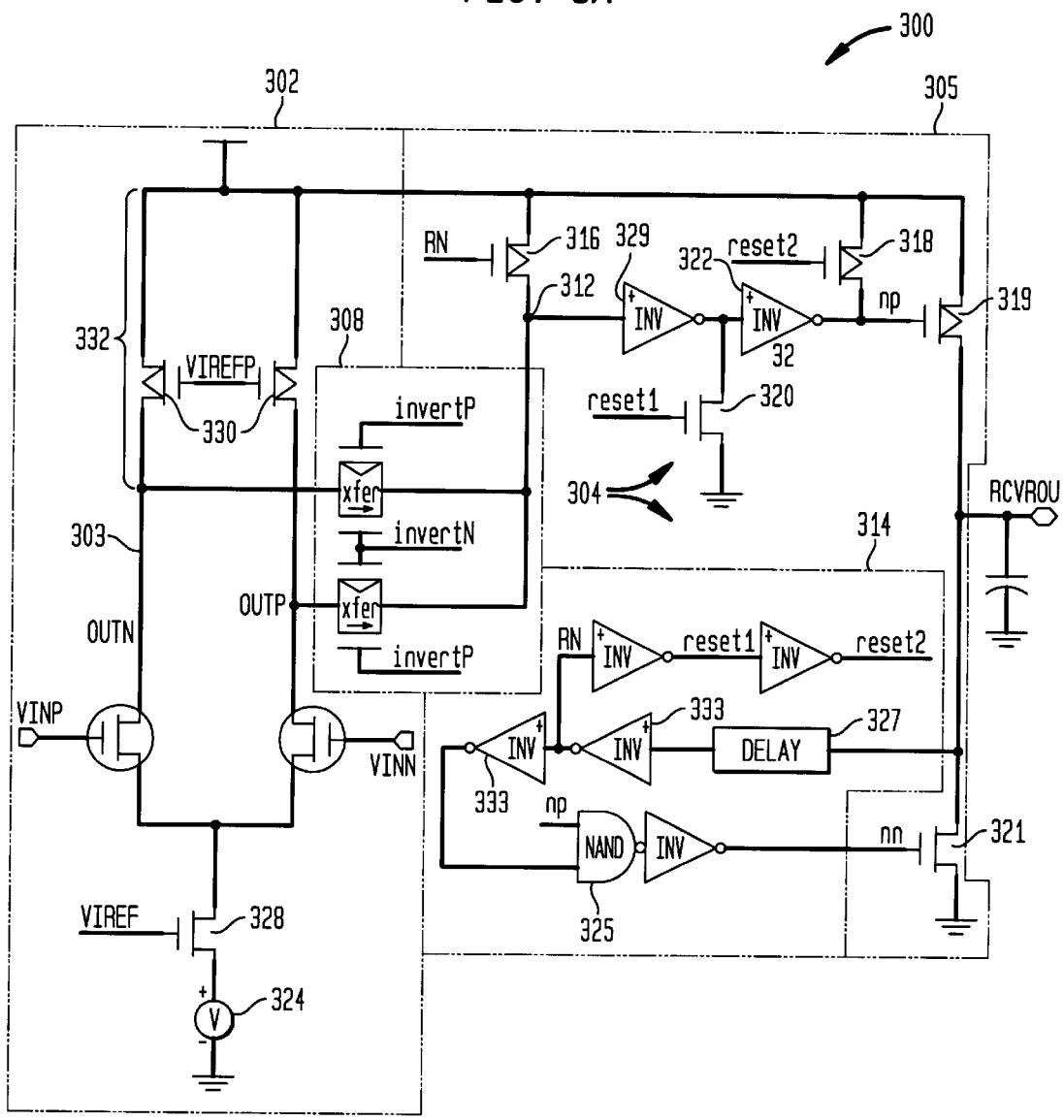
FIG. 6A is an illustrative schematic diagram of another embodiment of a clock receiver employing a differential amplifier, a switch or transfer gate and a pulse generator in accordance with the present invention.
Figure 6B:
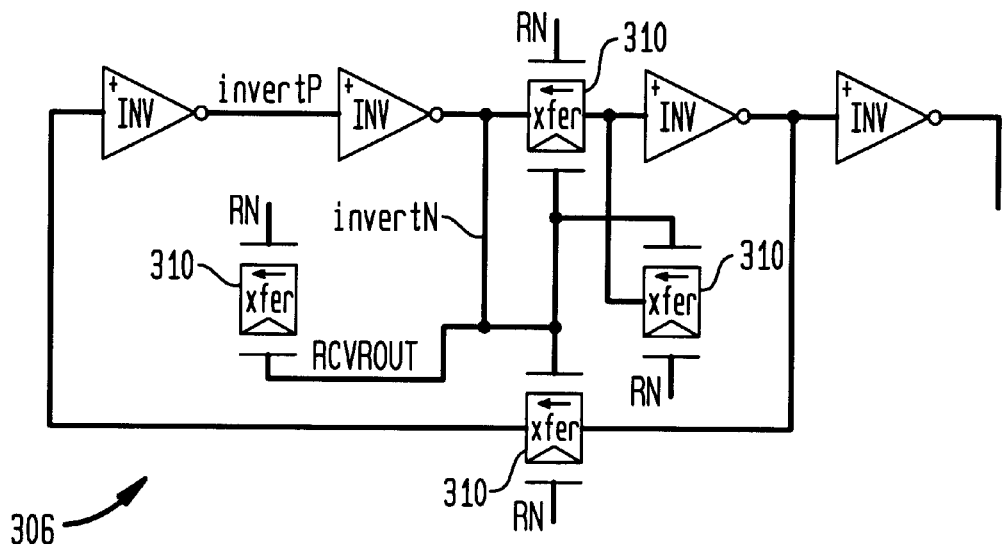
FIG. 6B is a schematic diagram a toggle switch/driver for controlling the switch or transfer gate in FIG. 6A in accordance with a RCRVOUT signal in accordance with the present invention.

Referring to FIGS. 6A–6D, schematic diagrams of a receiver circuit in accordance with an illustrative embodiment of the present invention is shown. In FIG. 6A, a receiver circuit 300 includes a first stage 302, which preferably includes a differential amplifier 303, and a second stage 305, which is shown having a self-resetting pulse generator 304. In FIG. 6B, a toggle switch or driver 306 is shown which works in conjunction with pulse generator 304 and a transfer gate or switch 308 of first stage 302.

In this example, toggle switch 306 employs four transfer gates 310, which are used to develop and invertP and an invertN signal based on a RCRVOUT signal and a reference node signal RN for controlling transfer gate 308. Transfer gate 308 switches the output at node 312 between OUTN and OUTP in accordance with the invertP and invertN signals to provide negative edged clock signals to pulse generator 304. Second stage 305 includes a reset circuit 314, which generates the RN signal, reset1 signal and reset2 signal using inverters 315. The RN, reset1 and reset2 signals to appropriately enable/disable transistors 316, 318 and 320, respectively. When RN and reset2 enable conduction of transistors 316 and 320, a positive edge is passed to RCRVOUT. When reset1 permits conduction through transistor 318, a positive edge is also passed to RCRVOUT after being converted from a negative edge by inverter 322. Inverters 329 and 322 are skewed to provide a quicker response time. This means that the strength of the transistors of in each inverter is different to improve speed. For example, inverters 322 and 329, may respectively include a weak P transistor and a strong N transistor and a strong P transistor and a weak N transistor.

Reset circuit 314 also includes a NAND gate 325 for timing the reset in accordance with signal np. A transistor 321 is a falling edge driver while transistor 323 is a rising edge driver. Transistors 321 and 323 are not on at the same time to prevent current overlap in the output signal. A delay line 327 may be provided which includes inverters which may be adjusted to provide a given pulse width for output signals. Inverters of delay line 327 are similar to inverters 333 and may be added or subtracted in even numbers.

Current source 324 provides current $I_1$ by employing transistor 328. Current $I_2$ is provided by employing transistors 330. Transistor 328 and transistors 330 operate mostly in saturation. A controlled ratio of $I_1$ and $I_2$ is ensured by a VREFP generator 332. In one embodiment, the value for Iis about 400 micro-amps, and the value for $I_2$ is about 250 micro-amps. These currents provide the hysteresis control needed to reduce the delay mismatch between clock signals.

The inversion of the output at node 312 is realized by transfer gates 308. A skewed self-reset driver/pulse generator in stage 305 is preferably employed although other pulse generators may be employed. In this example, the skewed self-reset driver/pulse generator permits good hysteresis control. Hysteresis may be between about –40 mV to about +40 mV. The hysteresis may be adjusted to other values as well.

Figure 1:
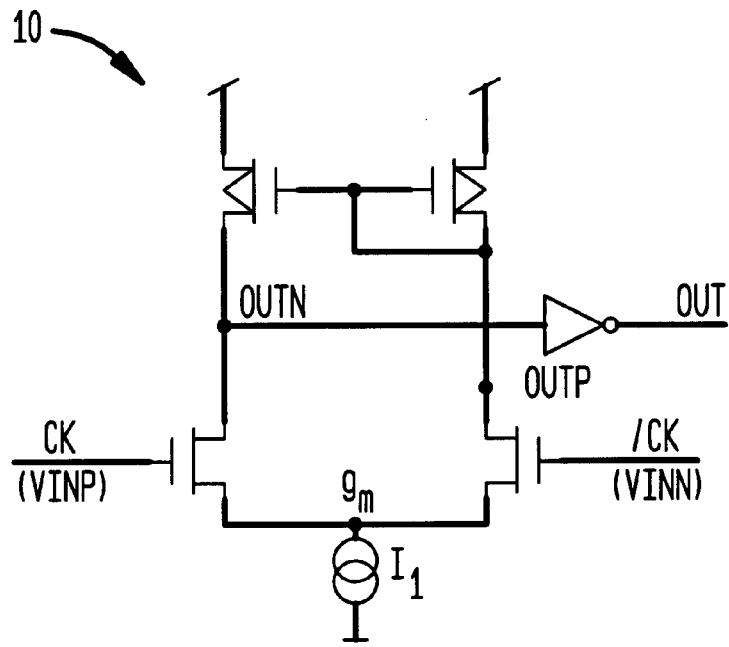
FIG. 1 is a schematic diagram a conventional clock receiver.
Figure 2:
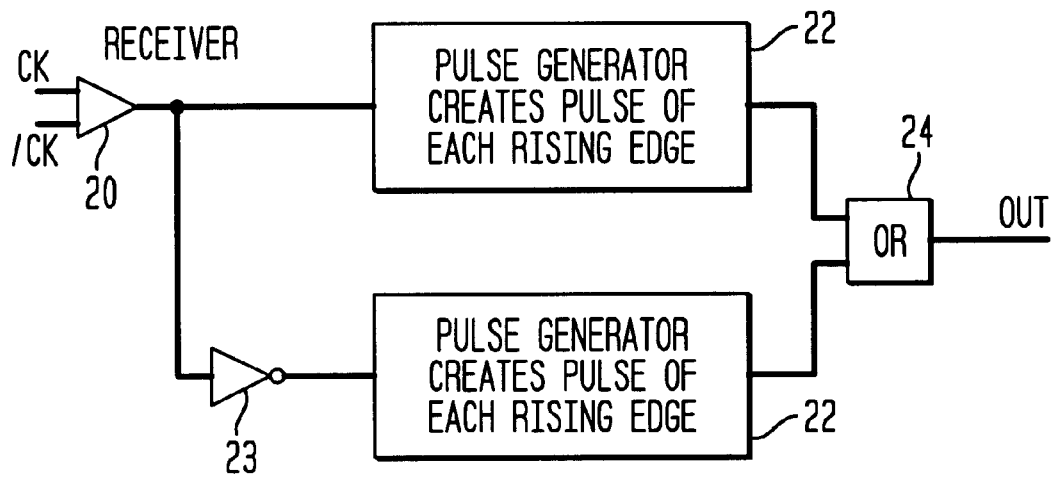
FIG. 2 is a schematic diagram a conventional clock receiver employing two pulse generators to provide a double data rate.
Figure 3:
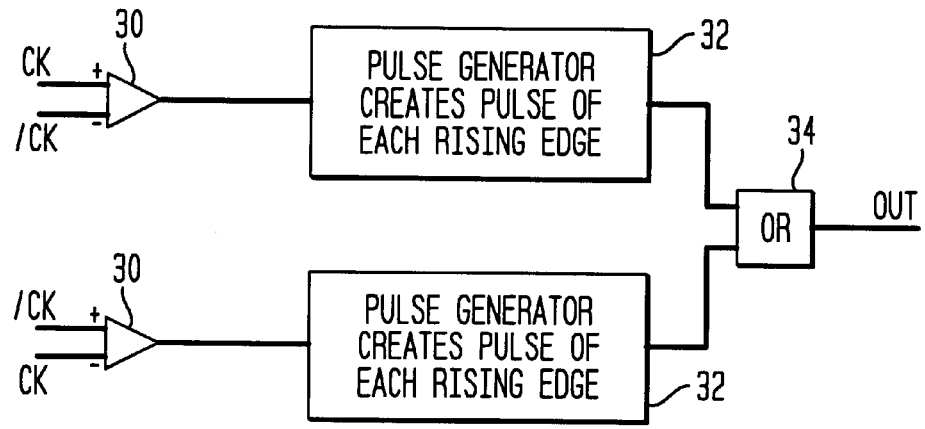
FIG. 3 is a schematic diagram a conventional clock receiver employing two pulse generators and two amplifiers to provide a double data rate.

Simulation results performed by the inventor indicate that a DC current load may provide a speed advantage over the loads typically used in prior art (see, e.g., FIG. 1). The DC current load of the invention may include resistor elements, diodes or transistor operating in the linear range. Advantageously, the DC load forms a DC current source, which provides a speed advantage.

In one embodiment, overall delay was reduced by about 50%–100% over the prior art circuits. For example, delays of about 950 ps were reduced to about 500 ps–650 ps in accordance with the present invention. The reduced gain, by going away from the current mirror, is overcompensated by the lack of delay (of the mirror) and the reduced load that the DC source presents to the nodes OUTN and OUTP.

Another advantage of the present invention is the increased input common mode resection (between VINN and VINP) as compared to the current mirror of FIG. 1. The common mode rejection range for the present invention is a threshold voltage higher as compared to FIG. 1 and eliminates the Miller effect. The present invention may replace transistors 330 with resistors, with a resistance of, for example, 2 to 4 kohms (with a supply voltage of between 2–2.5 volts). The toggle switch 306 of FIG. 6B may include a master-slave D-flip-flop. The pulse generator 304 may include a self-reset driver type, as shown.

Figure 6C:
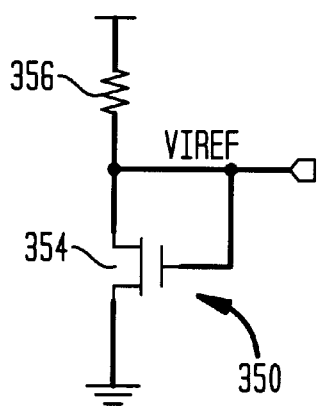
FIGS. 6C and 6D are schematic diagrams of illustrative reference circuits employed with the circuits of FIGS. 6A and 6B in accordance with the present invention.
Figure 6D:
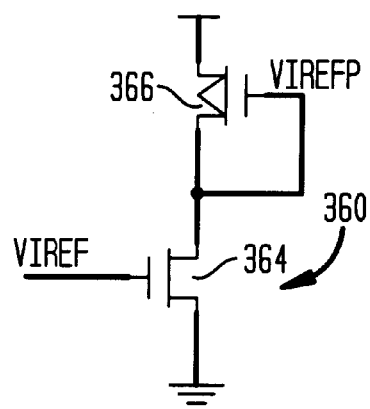

FIGS. 6C and 6D show reference current generator circuits 350 and 360. Circuit 350 generates VIREF by employing an NFET transistor 354 having its gate and source connected and a resistive load 356 connected between the gate and source of NFET and supply voltage. Circuit 360 includes an NFET 364 which has VIREF applied to its gate. A PFET 366 provides VIREFP, which is employed in current sources of VREFP generator 332 of FIG. 6A.

Figure 7A:
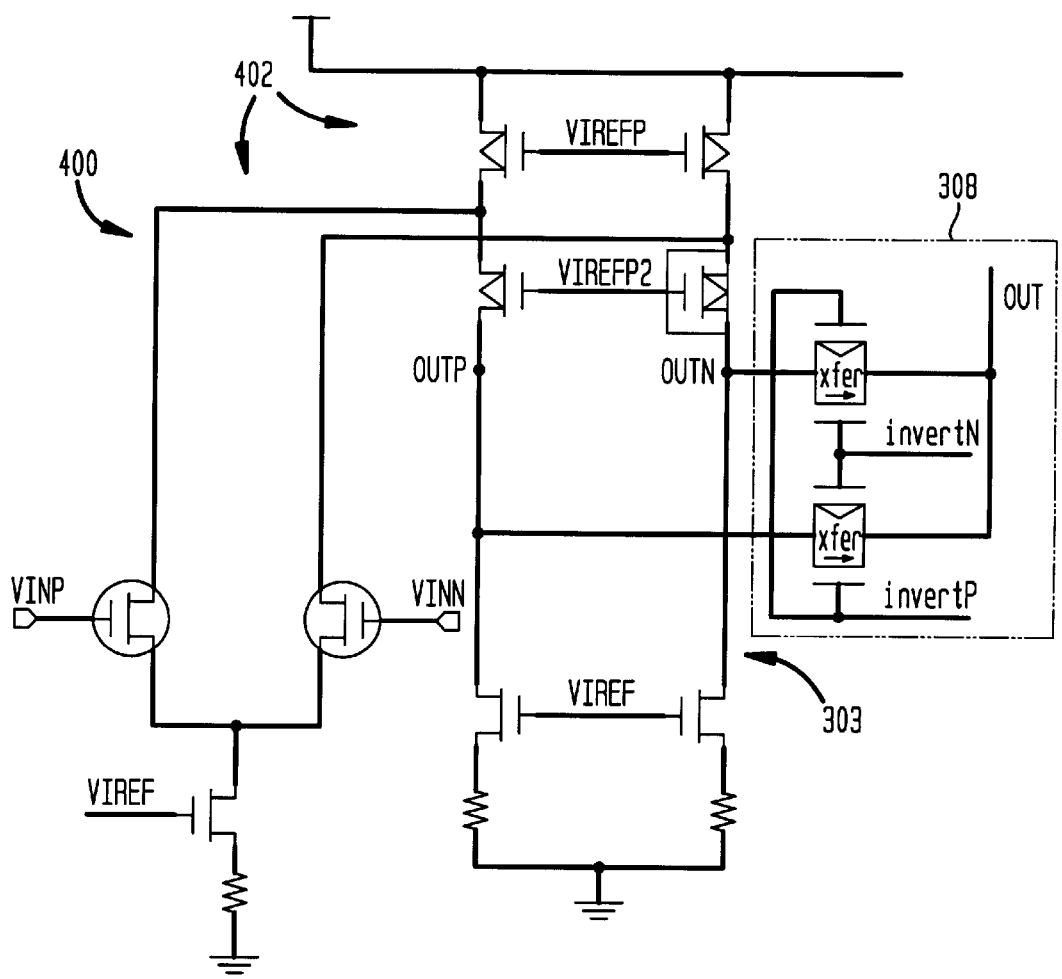
FIG. 7A is a schematic diagram of another embodiment of a clock receiver employing a differential amplifier with a folded cascode load in accordance with the present invention.
Figure 7B:
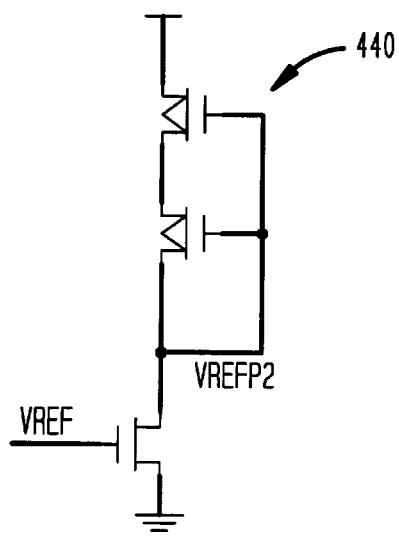
FIGS. 7B is schematic diagram of an illustrative reference circuit employed with the circuit of FIG. 7A in accordance with the present invention.

Referring to FIG. 7A, a first stage 400 of a receiver circuit is shown, which includes a folded cascode load 402. Transfer gate or switch 308 is included for switching between OUTN and OUTP as described above. In effect, folded cascode load 402 represents an additional differential amplifier. One advantage of stage 400 is increased speed with the elimination of the Miller effect. Resistors shown in FIG. 7A are optional and may be removed. FIG. 7B shows an illustrative circuit 440 for generating VIREFP2.

Figure 8:
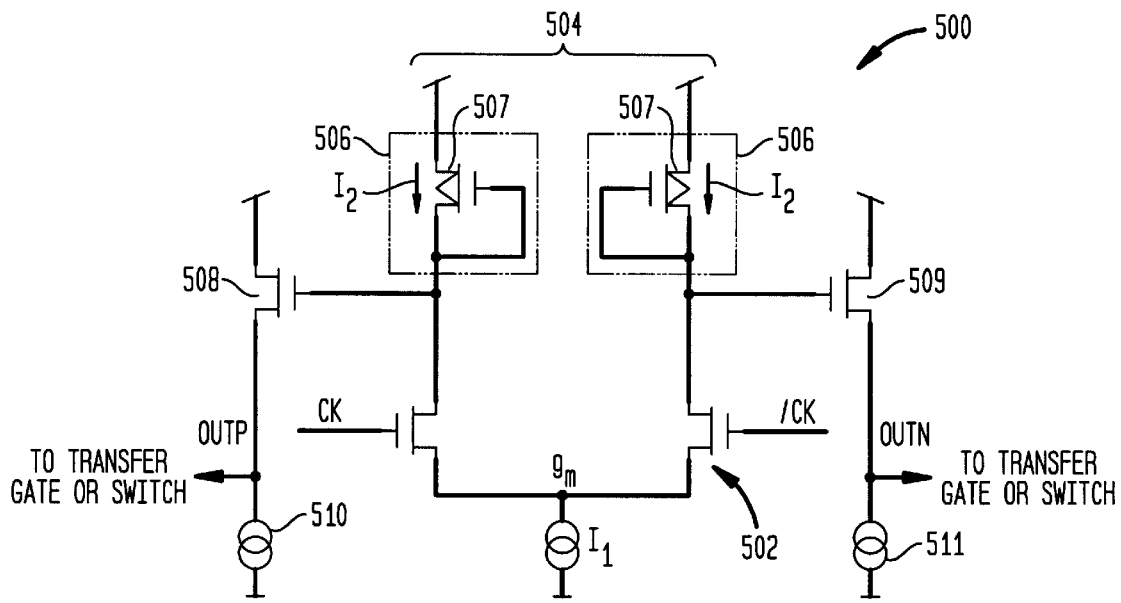
FIG. 8 is a schematic diagram of another embodiment of a clock receiver employing a fully differential amplifier with a additional current sources and a DC load in accordance with the present invention.

Referring to FIG. 8, another embodiment of a first stage 500 of a receiver circuit is shown in accordance with the present invention. A fully differential amplifier 502 is provided where a current mirror 504 includes DC elements 506 for providing I2. DC elements may include diodes 507 (as shown), resistors, and or transistors operating in the linear range. If resistors are employed for DC elements 506, the resistors preferably include a value in the range of a few kOhms, say 2–4 kohms when the value for $I_1$ is about 400 micro-amps, and the value for $I_2$ is about 250 micro-amps. Transistors 508 and 509 enable/disable current sources 510 and 511 to generate OUTP and OUTN signals. OUTP and OUTN signals are switched in accordance with transfer gates 308 (e.g., metal oxide semiconductor (MOS) transfer gates of FIG. 6A).

Figure 9:
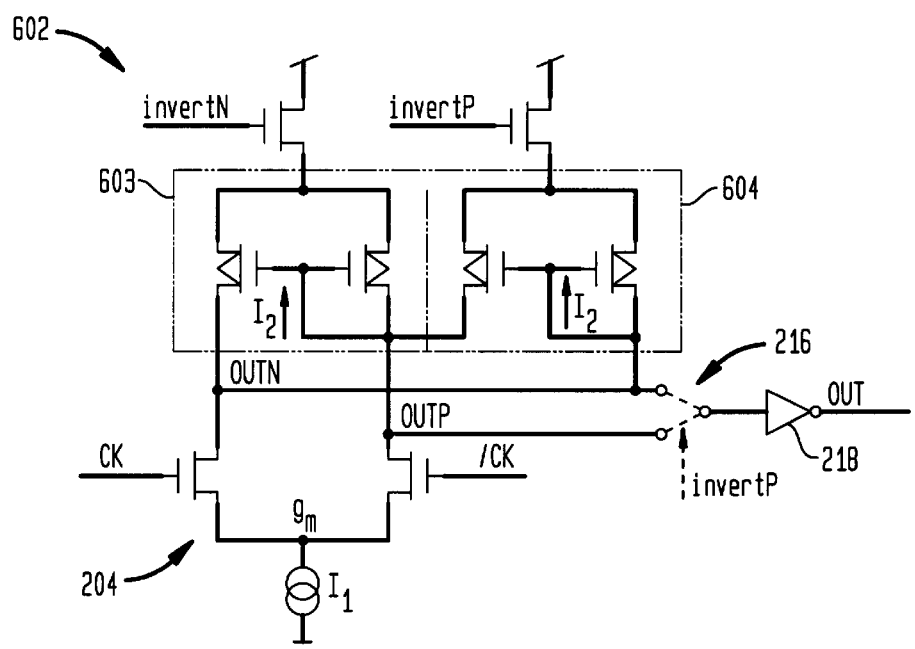
FIG. 9 is a schematic diagram of another embodiment of a clock receiver employing selectable current mirrors in accordance with the present invention.

Referring to FIG. 9, another embodiment of the present invention is shown. In this embodiment, a switchable current mirror circuit 602 is employed. Circuit 602 includes a first current mirror 603 which is enabled by the invertN signal and a second current mirror 604 which is enabled by the invertP signal.

Having described preferred embodiments for symmetric clock receiver for differential input signals (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A clock circuit, comprising:
    a first circuit stage including a differential amplifier for providing a first output signal and a second output signal, the first circuit stage including inputs for clock signals;
    a switch coupled to the first stage for switching an output polarity by selecting one of the first output signal and the second output signal generated by the first circuit stage in accordance with a control signal; and
    a second circuit stage coupled to the first circuit stage through the switch, the second circuit stage for shaping the first output signal and the second output signal input thereto from the switch, the second circuit stage including an output for outputting clock pulses based on the first output signal and the second output signal, the control signal being generated from the clock pulses.

2. The circuit as recited in claim 1, wherein the differential amplifier includes a current mirror for generating a first current to generate the first and second outputs signals.

3. The circuit as recited in claim 2, wherein the current mirror includes a first current mirror portion which generates the first output signal and a second current mirror portion which generates the second output signal wherein the first and the second current mirror portions are selectable in accordance with the control signal.

4. The circuit as recited in claim 1, wherein the differential amplifier includes a direct current source for generating a first current to generate the first and second outputs signals.

5. The circuit as recited in claim 1, wherein the differential amplifier includes:
    a first current source for generating a first current to generate the first and second outputs signals; and
    a second current source for generating a second current such that hysteresis at the output of the second circuit stage is controlled.

6. The circuit as recited in claim 5, wherein the hysteresis is given by $H=(I_{first}-I_{second}/2)/gm$ where $I_{first}$ is the first current, $I_{second}$ is the second current and gm is the transconductance of the differential amplifier.

7. The circuit as recited in claim 1, wherein the clock pulses are generated for both rising and falling edges of the input clock signals.

8. The circuit as recited in claim 1, further comprising a driver coupled to the switch, the driver including transfer gates driven by the output of the second stage, the driver for generating the control signal for the switch.

9. The circuit as recited in claim 1, wherein the second circuit stage includes a self-resetting pulse generator.

10. The circuit as recited in claim 1, wherein the first circuit stage includes a fully differential current mirror amplifier.

11. The circuit as recited in claim 1, wherein the first circuit stage includes a differential amplifier with a folded cascode load.

12. A double data rate clock circuit, comprising:
    a first circuit stage including a differential amplifier for providing a first output signal and a second output signal, the first circuit stage including inputs for clock signals, the first circuit stage including a transfer gate for switching an output polarity by selecting one of the first output signal and the second output signal generated by the differential amplifier in accordance with a control signal;
    a second circuit stage coupled to the first circuit stage, the second circuit stage including a pulse generator for receiving the first output signal and the second output signal and generating clock pulses to be output from the pulse generator in accordance with the first output signal and the second output signal; and
    a toggle switch for generating the control signal based on an output of the pulse generator.

13. The circuit as recited in claim 12, wherein the differential amplifier includes a current mirror for generating a first current to generate the first and second outputs signals.

14. The circuit as recited in claim 13, wherein the current mirror includes a first current mirror portion which generates the first output signal and a second current mirror portion which generates the second output signal wherein the first and the second current mirror portions are selectable in accordance with the control signal.

15. The circuit as recited in claim 12, wherein the differential amplifier includes a direct current source for generating a first current to generate the first and second output signals.

16. The circuit as recited in claim 12, wherein the differential amplifier includes:
    a first current source for generating a first current to generate the first and second output signals; and
    a second current source for generating a second current such that hysteresis at the output of the second circuit stage is controlled.

17. The circuit as recited in claim 16, wherein the hysteresis is given by $H=(I_{first}-I_{second}/2)/gm$, where $I_{first}$ is the first current, $I_{second}$ is the second current and gm is the transconductance of the differential amplifier.

18. The circuit as recited in claim 12, wherein the clock pulses are generated for both rising and falling edges of the input clock signals.

19. The circuit as recited in claim 12, wherein the toggle switch includes transfer gates driven by the output of the second circuit stage, the driver for generating the control signal for the transfer gates.

20. The circuit as recited in claim 13, wherein the pulse generator includes a self-resetting pulse generator.

21. The circuit as recited in claim 13, wherein the first circuit stage includes a folded cascode load differential amplifier.

22. The circuit as recited in claim 13, wherein the first circuit stage includes a fully differential current mirror amplifier.

23. A clock circuit, comprising:
a first circuit stage for providing a first output signal and a second output signal, the first circuit stage including inputs for clock signals;
a switch coupled to the first stage for switching an output polarity by selecting one of the first output signal and the second output signal generated by the first circuit stage in accordance with a control signal; and
a second circuit stage coupled to the first circuit stage through the switch, the second circuit stage for shaping the first output signal and the second output signal input thereto from the switch, the second circuit stage including an output for outputting clock pulses based on the first output signal and the second output signal, the control signal being generated from the clock pulses;
a driver coupled to the switch, the driver including transfer gates driven by the output of the second stage, the driver for generating the control signal for the switch.

24. A clock circuit, comprising:

a first circuit stage for providing a first output signal and a second output signal, the first circuit stage including inputs for clock signals;

a switch coupled to the first stage for switching an output polarity by selecting one of the first output signal and the second output signal generated by the first circuit stage in accordance with a control signal;

and a second circuit stage coupled to the first circuit stage through the switch, the second circuit stage including a self-resetting pulse generator for shaping the first output signal and the second output signal input thereto from the switch, the second circuit stage including an output for outputting clock pulses based on the first output signal and the second output signal, the control signal being generated from the clock pulses.

* * * * *